(12) United States Patent
Nawashiro et al.

(10) Patent No.: US 7,556,404 B2
(45) Date of Patent: Jul. 7, 2009

(54) LIGHT SOURCE DEVICE WITH EQUALIZED COLORS SPLIT, AND METHOD OF MAKING SAME

(75) Inventors: Mitsuhiro Nawashiro, Aichi-ken (JP); Satoshi Inagaki, Aichi-ken (JP)

(73) Assignee: Toyoda Gosei Co., Ltd., Nishikasugai-gun, Aichi-ken (JP)

( * ) Notice: Subject to any disclaimer, the term of this patent is extended or adjusted under 35 U.S.C. 154(b) by 0 days.

(21) Appl. No.: 11/491,489

(22) Filed: Jul. 24, 2006

(65) Prior Publication Data

US 2007/0019409 A1    Jan. 25, 2007

(30) Foreign Application Priority Data

Jul. 25, 2005   (JP)   ............................. 2005-214664
Apr. 26, 2006   (JP)   ............................. 2006-121783

(51) Int. Cl.
*F21V 9/00*   (2006.01)
*H01L 33/00*  (2006.01)

(52) U.S. Cl. .................... 362/293; 362/555; 362/800; 257/98

(58) Field of Classification Search ................ 362/606, 362/293, 231, 235, 84, 800, 555, 558, 260; 257/98, 100, 79; 313/512, 485
See application file for complete search history.

(56) References Cited

U.S. PATENT DOCUMENTS

| | | | | |
|---|---|---|---|---|
| 2,238,409 A | * | 4/1941 | Bomberger | 362/253 |
| 5,630,661 A | * | 5/1997 | Fox | 362/187 |
| 5,909,062 A | * | 6/1999 | Krietzman | 307/64 |
| 6,319,425 B1 | * | 11/2001 | Tasaki et al. | 252/301.36 |
| 6,345,903 B1 | * | 2/2002 | Koike et al. | 362/249 |
| 6,517,213 B1 | * | 2/2003 | Fujita et al. | 362/84 |
| 6,878,467 B2 | * | 4/2005 | Chung et al. | 428/690 |
| 6,881,980 B1 | * | 4/2005 | Ting | 257/81 |
| 7,004,600 B2 | * | 2/2006 | Echterling | 362/187 |
| 7,078,734 B2 | * | 7/2006 | Hiramoto | 257/98 |
| 7,267,461 B2 | * | 9/2007 | Kan et al. | 362/373 |
| 2002/0070449 A1 | * | 6/2002 | Yagi et al. | 257/734 |
| 2002/0093287 A1 | * | 7/2002 | Chen | 313/512 |
| 2002/0149943 A1 | * | 10/2002 | Obata | 362/339 |
| 2003/0002272 A1 | * | 1/2003 | Suehiro et al. | 362/84 |
| 2004/0070338 A1 | * | 4/2004 | Noguchi et al. | 313/512 |
| 2004/0135504 A1 | * | 7/2004 | Tamaki et al. | 313/512 |
| 2004/0190304 A1 | * | 9/2004 | Sugimoto et al. | 362/55 |
| 2004/0239243 A1 | * | 12/2004 | Roberts et al. | 313/512 |
| 2005/0046949 A1 | * | 3/2005 | Kuo et al. | 359/599 |

(Continued)

FOREIGN PATENT DOCUMENTS

JP    2004-265727    9/2004

*Primary Examiner*—Ismael Negron
*Assistant Examiner*—David R Crowe
(74) *Attorney, Agent, or Firm*—McGinn IP Law Group, PLLC (57) ABSTRACT

A light source device includes a light emitting diode (LED) device, a lens and a light diffusing layer. The LED device includes an LED chip, which emits light, and a fluorescent, which converts a part of the light from the LED chip. The lens is located on a side of a light emitting face of the LED device. The light diffusing layer is located between the LED device and the lens. An air layer exists between the light diffusing layer and the LED device or between the light diffusing layer and the lens.

17 Claims, 11 Drawing Sheets

U.S. PATENT DOCUMENTS

2005/0139846 A1* 6/2005 Park et al. ..................... 257/98
2005/0201109 A1* 9/2005 Shimura ..................... 362/382
2006/0054915 A1* 3/2006 Chang ........................ 257/100

* cited by examiner

LIGHT SOURCE DEVICE WITH EQUALIZED COLORS SPLIT, AND METHOD OF MAKING SAME

CROSS REFERENCE TO RELATED APPLICATION

This application is based upon, claims the benefit of priority of, and incorporates by reference Japanese Patent Application No. 2005-214664, which was filed on Jul. 25, 2005, and No. 2006-121783, which was filed on Apr. 26, 2006.

BACKGROUND OF THE INVENTION

The present invention relates to a light source device that includes a light emitting diode (LED) as a light source. The present invention specifically relates to the light source device that includes a LED chip with a fluorescent substance (e.g., a phosphor).

In case that an illumination device for a specific area is needed, an LED device, which converges a light from the LED with a lens, is used as a spot light. Meanwhile, an LED device, which emits white illumination, is recently developed and put to practical use.

A typical white LED includes a blue LED chip and a fluorescent substance that converts a part of a blue light from the blue LED chip and emits yellow luminescence. The blue light, which is emitted from the blue LED chip, and the yellow luminescence, which is converted and emitted by the fluorescent substance, are mixed and observed as white illumination. Because there is a difference between a wavelength of the blue light and the yellow fluorescence light, a color split is observed around a periphery of the white illumination. The fluorescent material works as a light diffusing agent. Therefore, if a sufficient amount of the fluorescent material is used in a white LED, a light emitted from the white LED is well-equalized and a color split around a periphery of the white illumination is reduced. However, an amount of the fluorescent material should be decided by considering a balance between a blue light and a yellow luminescence. Because the amount of the fluorescent substance is not enough for diffusing when the white LED emits white illumination, a good light diffusion cannot be expected. When the amount of the fluorescent substance is small in the white LED, a light diffusion rate is reduced. Then, an illumination from an LED device is bluish white at the center of the illumination and yellowish white at the periphery of the illumination. Furthermore, when the light from the LED device is converged by a lens, a color split will occur because of an aberration of the lens.

A combined lens is generally used in order to improve such a color split. The combined lens can improve the color split around the center of an illumination, but cannot improve it around the periphery of the illumination. On the other hand, a lens can include a diffusing agent for diffusing a light from the LED device. In this case, however, the lens cannot converge the light from the LED well.

SUMMARY OF THE INVENTION

An exemplary feature of the invention is to overcome the above-mentioned limitations. A light source device according to the present invention has a well-equalized illumination with a high luminous efficiency.

Basically, the light source device includes a light emitting diode (LED) device, a lens and a light diffusing layer. The LED device includes an LED chip, which emits light, and a fluorescent substance, which converts a part of the light from the LED chip. The lens is located on a side of a light emitting face of the LED device. The light diffusing layer is located between the LED device and the lens. An air layer exists between the light diffusing layer and the LED device or between the light diffusing layer and the lens. In the exemplary embodiments described herein, the light diffusing layer is a sheet having irregularities on at least one surface, so that the air gap, in combination with the surface irregularities, provides the color equalization by changing angles of the entry of the light into the focusing lens in accordance with differences of indices of refraction due to the air gap as opposed to simple attachment by an adhesive without an air gap.

In another exemplary aspect of the invention, a light source device includes a light emitting diode (LED) device and a light diffusing layer. The LED device includes an LED chip, which emits light, and a fluorescent, which converts a part of the light from the LED chip. A light diffusing layer located above a light emitting face of the LED device. The light diffusing layer is adhered to the light emitting face of the LED device with some distance therebetween.

BRIEF DESCRIPTION OF THE DRAWINGS

The accompanying figures, in which like reference numerals refer to identical or functionally similar elements throughout the separate views and which, together with the detailed description below, are incorporated in and form part of the specification, serve to further illustrate various exemplary embodiments and to explain various principles and advantages all in accordance with the present invention.

DETAILED DESCRIPTION OF EXEMPLARY EMBODIMENTS

An exemplary light source device of the present invention includes a light emitting element and fluorescent substance that is excited by a light from the light emitting element. The material for forming the light-emitting element is not particularly limited. A light-emitting element having Group III nitride compound semiconductor layers, that is, a Group III nitride compound semiconductor light-emitting element can be preferably used. Group III nitride compound semiconductors are represented by the general formula $Al_xGa_yIn_{1-x-y}N$ ($0<X<1$, $0<Y<1$, $0<X+Y<1$), which includes so-called binary compounds such as AlN, GaN and InN, and so-called ternary compounds such as $Al_xGa_{1-x}N$, $Al_xIn_{1-x}N$ and $Ga_xIn_{1-x}N$ ($0<x<1$). These group III elements may be partially replaced by boron (B), thallium (Ti), etc. The nitrogen (N) may be partially replaced by phosphorus (P), arsenic (As), antimony (Sb), bismuth (Bi), etc. An element-functional portion of the light-emitting element is preferably made of one member selected from the binary or ternary Group III nitride compound semiconductors.

Each of the Group III nitride compound semiconductors may contain any optional dopant. Si, Ge, Se, Te, C, etc. may be used as n-type impurities. Mg, Zn, Be, Ca, Sr, Ba, etc. may be used as p-type impurities. Incidentally, after doped with p-type impurities, the Group III nitride compound semiconductor may be subjected to electron beam irradiation, plasma irradiation or heating in a furnace.

Each of the Group III nitride compound semiconductors may be formed by a metal organic chemical vapor deposition method (MOCVD method) or may be formed by a known method such as a molecular beam epitaxy method (MBE method), a halide vapor phase epitaxy method (HVPE method), a sputtering method, an ion-plating method, or an electron shower method.

The material of the substrate on which the Group III nitride compound semiconductor layers will be grown is not particularly limited if the Group III nitride compound semiconductor layers can be grown on the substrate. Examples of the material of the substrate which can be used include sapphire, spinel, silicon, silicon carbide, zinc oxide, gallium phosphide, gallium arsenide, magnesium oxide, manganese oxide, and Group III nitride compound semiconductor monocrystal. Particularly, a sapphire substrate is preferably used.

The color of the light emitting element can be chosen in response to a preferable color for the LED device. When the LED device emits white illumination, the light emitting element that emits blue color can preferably be used. A plurality of the light emitting elements can be used in the LED device. Also, not only can the same kind of the light emitting element be used, but also different kinds of light emitting elements can be used in the LED device.

The LED device includes a fluorescent material, which is excited by light from the light emitting element and emits fluorescence. The fluorescent substance is chosen according to the illumination color of the light emitting element. For example, when the LED device emits white illumination, the LED device can include a blue light emitting element and a fluorescent material that emits yellow fluorescence. One possible fluorescent material for a yellow light is represented by the general formula $y_{3-x}Gd_xAl_{5-y}Ga_yO_{12}$:Ce ($0<X<3$, $0<Y<5$), which is so-called as Yttrium Aluminum Garnett fluorescent (YAG fluorescent). YAG fluorescent converts blue light to yellow or yellow-green fluorescence. Yttrium can be partially or totally replaced with Lu or La. Also, a part of or all of Al can be replaceable with In or Sc. The yellow fluorescent, which can be used to the LED device, possibly include: $(Ca_{0.49}Mg_{0.50})_3(Sc_{0.75}Y_{0.25})_2Si_3O_{12.015}$:$Ce^{3+}$, $(Ca_{0.99})_3Sc_2Si_3O_{12.015}$:$Ce^{3+}$, $(Ca_{0.49}Mg_{0.50})_3(Sc_{0.50}Y_{0.50})_2Si_3O_{12.015}$:$Ce^{3+}$, $Ca_{0.49}Mg_{0.50})_3(Sc_{0.50}Lu_{0.50})_2Si_3O_{12.015}$:$Ce^{3+}$, $Ba_2SiO_4$:$Eu^{2+}$.

The emission color of Fluorescent, which can be applied to the present invention, is not limited to yellow. Red emission color or green emission color of a fluorescent material can be used for the LED device.

Red fluorescent material, which can be used for the LED device, possibly include: such as $Y_2O_3$:Eu, $Y_2O_2S$:Eu, (Y,La)$O_3$:Eu, (Ca,Sr)S:Eu, $Y_2Al_5O_{12}$:Eu, $Y_3(Al,Ga)_5O_{12}$:Eu, $SrY_2S_4$:Eu, $Y_2O_2S$(Eu,Bi), $YVO_4$(Eu,Bi), SrS:Eu, $CaLa_2S_4$:Ce.

Green fluorescent material, which can be used for the LED device, possibly include: (Y, Ce)$_3$(Al, Ga)$_5O_{12}$:Tb, $BaMgAl_{10}O_{17}$:Eu, $Ba_2MgSi_2O_7$:Eu, (Sr,Ca,Ba)(Al,Ga)$_2S_4$:Eu, $BaSiO_4$:Eu, $YBO_3$:Ce,Tb, $(Ca,Sr)_{p/2}Si_{12-p-q}Al_{p+q}O_{1-q}$N:Ce, $Ca_8Mg(SiO_4)_4Cl_2$:Eu, $SrAl_2O_4$:Eu, $SrAl_{14}O_{25}$:Eu, $(Ca_{0.99})_3Sc_2Si_3O_{12.015}$:$Ce^{3+}$, $(Ca_{0.49}Zn_{0.50})_3Sc_2Si_3O_{12.015}$:$Ce^{3+}$.

A lens is located on a light emitting face of the LED device. A light, which is controlled by the lens, is emitted from the light source device. The lens, which focuses the light from the light emitting element, is used for any purpose of the light source device. A convex surface of the lens can be formed in spherical surface, elliptic surface or parabolic surface. The lens can be made with synthetic resin, such as polycarbonate, acrylic resin, epoxy resin, or inorganic material, such as glass.

One exemplary light source device of the present invention includes a light diffusing layer between the LED device and the lens. The light diffusing layer is located above the light emitting face of the LED device or below a light receiving face of the lens. The light diffusing layer is located apart from the LED device and the lens in a predetermined distance. In other words, there is an air layer between the light diffusing layer and the light emitting face or the light receiving face. Thus, the light diffusing layer is not located on the light emitting face of the LED device or the light receiving face of the lends. Compared to an LED device that has the light diffusing layer directly on the light emitting face, a light extracting efficiency of the LED device that has the light diffusing layer above the light emitting face is improved. Also, compared with an light source device that has the light diffusing layer on the light receiving face of the lens, a light incident efficiency of the light source device that has the light diffusing layer below the lens is improved.

The light source device preferably includes a plurality of the light diffusing layers. Light transmittance at the light diffusing layer is decreased if diffusing effect is increased. In other words, the light transmittance and the diffusing effect are in a trade-off relationship. Thus, in order to keep good light transmittance, the light diffusing layer should be thin. But that is not enough to have good diffusing effect. It is easier to keep good light transmittance if a plurality of light diffusing layers, which are thin and have less diffusing effect, are used. The plural steps of diffusion increase the diffusing effect. Furthermore, the light transmittance is well kept because those light diffusing layers exemplarily used are thin. Considering the light transmittance and the diffusing effect, the light source device preferably includes two light diffusing layers.

The light diffusing layer is made of transparent resin (polyethylene resin, vinyl chloride resin, polyester resin, polyethylene terephthalate, polycarbonate resin, etc.). The light diffusing layer is formed in a sheet that has concave-convex surfaces.

The light source device of the present invention preferably includes a light diffusing sheet (hereinafter, both sides diffusing sheet) that has light diffusing surfaces on both sides of the sheet. In other words, the both sides diffusing sheet includes two light diffusing layers. Therefore, when the light from the LED device reaches the light diffusing sheet, the light is diffused at an incident side of the light diffusing sheet and then diffused at a light emitting side of the light diffusing sheet. Thus, the light from the LED device is diffused in two steps at the two sides of the diffusing sheet. If the light diffusing sheet includes one diffusing surface and one flat surface, then a part of the light from the LED device is reflected at the flat surface. As a result, the part of the light is directed to an undesirable direction. In contrast, loss of the light of the exemplary embodiments of the present invention is reduced because the light diffusing sheet includes two light diffusing surfaces and these light diffusing surfaces do not work as a reflecting surface.

As mentioned above, the light diffusing layer is apart from the light emitting face of the LED device or the light receiving face of the lens in a predetermined distance. If the light diffusing layer is directly adhered on the LED device or the lens with no clearance, then the surface of the light diffusing layer is effected on its optic feature by the adhesive. Also, if the light diffusing layer is fixed on the LED device or the lens without the adhesive, the surface of the light diffusing layer is deformed. As a result, the light diffusing layer can not show as good diffusing performance. Because the light diffusing layer of the present invention is located between the LED device and the lens, the light diffusing layer can show better diffusing performance.

The thickness of the light diffusing sheet is not limited. For example, 50 µm-200 µm of the light diffusing sheet can be used. In detail, LIGHT UP 75 PBA, 100 PBU (products' names, source: KIMOTO Co., Ltd.) can be used as the diffusing sheet having two diffusion surfaces. The distance between the light diffusing sheet and the LED device (or the lens) is not limited. In case that the light diffusing sheet is fixed above the light emitting face of the LED device, the light diffusing sheet is preferably adjacent to the light emitting face in order to take the light from the LED device into the light diffusing sheet easily. Because the light diffusing sheet can take the light from the LED device, including a lateral direction light and an oblique direction light, a luminous efficiency can be increased. Meanwhile, in case that the light diffusing sheet is fixed below the light receiving face of the lens, the light diffusing face is preferably adjacent to the light receiving face in order to take the light through the light diffusing sheet into the lens easily. Because the lens can take the light through the light diffusing sheet, a luminous efficiency can be increased. For the reasons as mentioned above, the distance between the light diffusing sheet and the LED device (or the lens) is preferably less than 0.2 mm. For example, the distance can be set in a range of approximately 0.01 mm-0.2 mm.

First Embodiment

Figure 1:
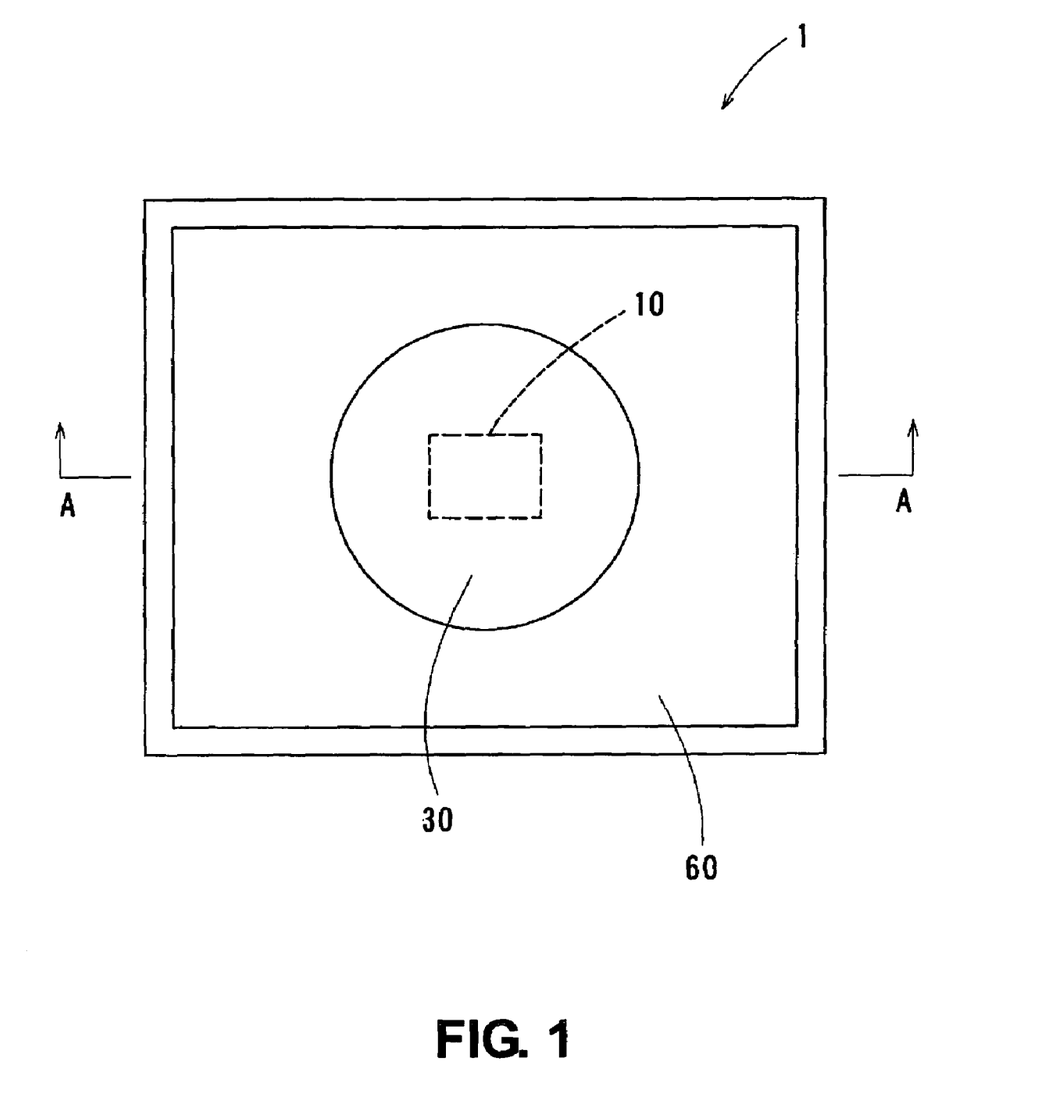
FIG. 1 is a plane view of a light source device in an exemplary first embodiment.
Figure 2:
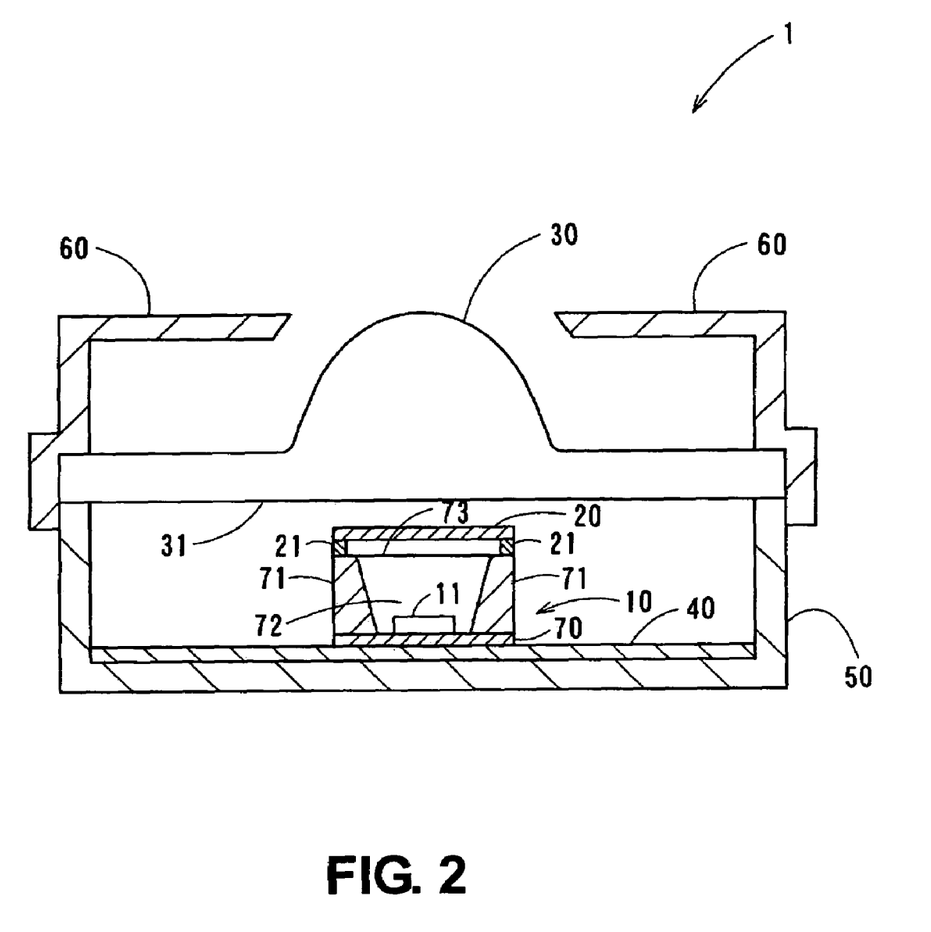
FIG. 2 is a cross sectional view at A-A line of FIG. 1.

Referring to FIG. 1 and FIG. 2, the light source device 1 includes a surface mounted type light emitting diode device 10 (hereinafter referred to as LED device), a lens 30, a circuit board 40, a housing 50 and a cover 60. The LED device 10 includes an LED chip 11, a substrate 70, a reflector 71 and a sealing member 72 (see FIG. 2). The LED device 10 also includes a Zener diode (not shown) for anti-electrostatic protection.

Figure 3:
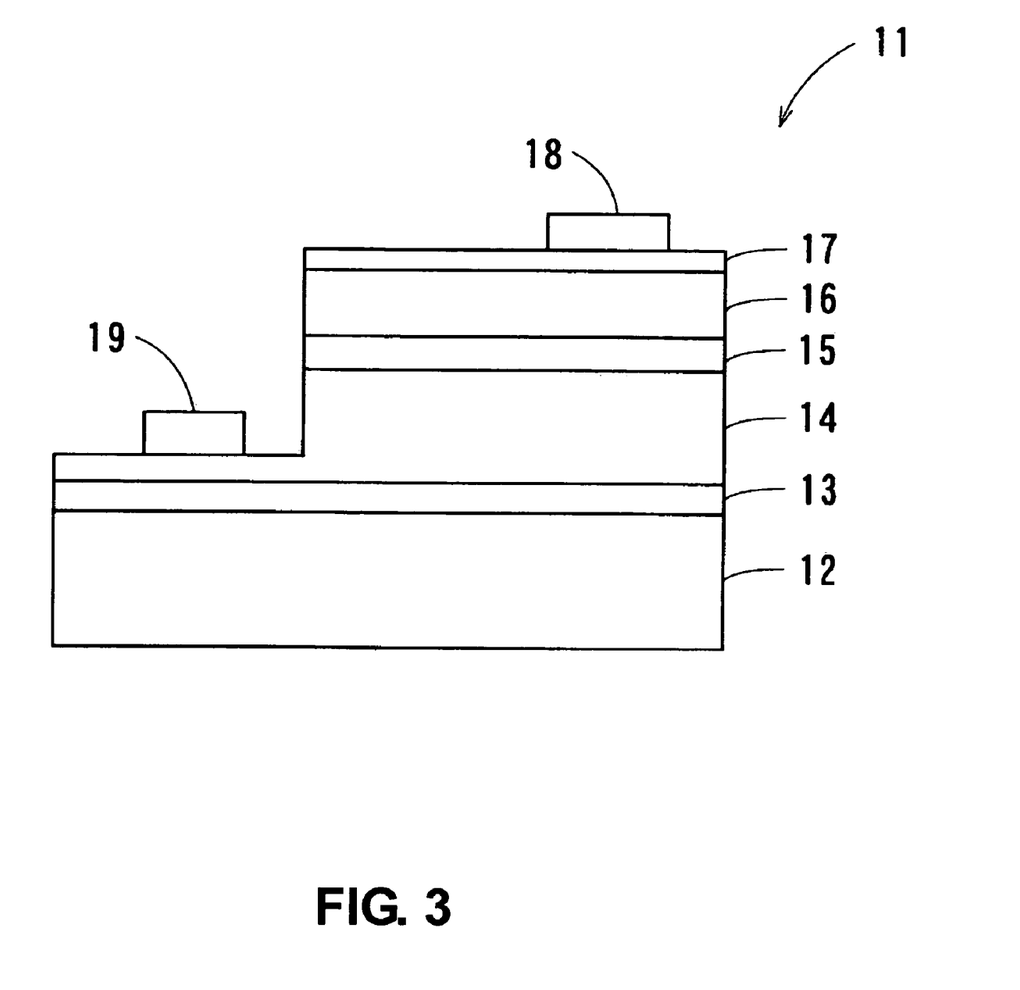
FIG. 3 is a cross sectional view of an LED chip that is installed in the light source device.

As shown in FIG. 3, the LED chip 11 includes a sapphire substrate 12 and a plurality of layers formed on the sapphire substrate 12. It has a main emission peak wavelength of around 470 nm. The LED chip 11 includes following layers: a p-type layer 16 is a p-GaN: Mg layer; a layer 15 includes InGaN layers that includes light emitting layers; an n-type layer 14 is an n-GaN:Si layer; a buffer layer 13 is an AlN layer; and substrate 12 is a sapphire substrate.

The n-type layer 14 of GaN with n-type impurity Si doped is grown through the buffer layer 13 on the substrate 12. Although the substrate 12 is of sapphire in this embodiment, it may be, instead, of spinel, silicon carbide, zinc oxide, magnesium oxide, manganese oxide, zirconium boride or III group nitride system compound semiconductor single crystal etc. The buffer layer 13 of AlN is grown by MOCVD. It may be of GaN, InN, AlGaN, InGaN, AlGaInN etc. and may be grown by molecular beam epitaxy (MBE), hydride vapor phase epitaxy (HVPE), sputtering, ion plating, electron shower etc. When the substrate 12 is of III group nitride system compound semiconductor, the buffer layer can be omitted.

Meanwhile, the substrate and buffer layer can be removed after forming the semiconductor element, when needed.

Although the n-type layer 14 is of GaN, it may be of AlGaN, InGaN or AlInGaN. Although the n-type impurity Si is doped in the n-type layer 14, another n-type impurity, e.g. Ge, Se, Te and C may be doped therein.

The layer 15 including a light emitting layer can have a quantum well structure (multi-quantum well structure or single quantum well structure). The structure of light emitting element may be of single-hetero type, double-hetero type or homo junction type.

The layer 15 including a light emitting layer may also include a Mg-doped III group nitride system compound semiconductor layer with a large bandgap on the p-type layer 16 side. This prevents electrons injected into the layer 15 including the light emitting layer from dispersing into the p-type layer 16.

The p-type layer 16 of GaN with p-type impurity Mg doped is grown on the layer 15 including the light emitting layer. The p-type layer 16 may be of AlGaN, InGaN or AlInGaN. P-type impurity may be Zn, Be, Ca, Sr or Ba. After doping p-type impurity, the layer 16 can be treated by a known method such as electron beam radiation, annealing and plasma radiation to lower the resistivity, but this treatment is not needed necessarily.

In this embodiment, the III group nitride system compound semiconductor layer is grown, under general conditions, by MOCVD, molecular beam epitaxy (MBE), hydride vapor phase epitaxy (HVPE), sputtering, ion plating, electron shower etc.

The n-type electrode 19 includes two layers of Al and V. After growing the p-type layer 16, part of the p-type layer 16, layer 15 including the light emitting layer and n-type layer 14 is removed by etching, then the n-type electrode 19 is formed on the exposed n-type layer 14 by vapor deposition.

A transparent electrode 17 formed on the p-type layer 16 is a thin film including gold. Also, a p-type electrode 18 formed on the transparent electrode 17 by vapor deposition is of material including gold. After forming the layers and electrodes as described above, the wafer is separated into chips.

Meanwhile, on the back surface (on the surface side with no semiconductor layer formed) of the substrate 12, a reflection layer may be formed that can include such materials as Al, Ag, titanium nitride, hafnium nitride, zirconium nitride, tantalum nitride, etc. With the reflection layer, light proceeding to the substrate 12 side can be efficiently reflected and converted, thereby enhancing the light extraction efficiency. Such a reflection layer can be formed by a known method such as deposition.

A reflector 71 can be of white resin and can be molded such that its inner surface forms a cup portion giving a desired angle to the optical axis.

The sealing member 72 is embedded in the cup portion to cover the LED chip 11. In this embodiment, the sealing member 72 is of epoxy resin with a yellow system phosphor dispersed therein.

A diffusing sheet 20 is fixed at a light emitting side of the LED device 10. In detail, a lower surface of the periphery of the diffusing sheet 20 is adhered to an upper surface of the periphery of the reflector 71 by adhesive agent 21. Thus, the diffusing sheet 20 covers a light emitting face 73 of the LED device 10 through an air layer. The adhesive agent 21 can control a distance (a thickness of the air layer) between the diffusing sheet 20 and the light emitting face 73. In the present embodiment, the adhesive agent 21 is a silicone resin adhesive and the thickness of the air layer is 0.1 mm. Other adhesive methods, such as a double-faced adhesive tape, can be used to adhere the diffusing sheet 20 to the light emitting face 73 instead of the adhesive agent 21.

A thickness of the diffusing sheet 20 is about 125 μm and the diffusing sheet 20 is made of PET (polyethylene terephthalate). A diffusing film, which is commercially available, such as LIGHT UP 100 PBU (products' name, source: KIMOTO Co., Ltd.), can be used as the diffusing sheet 20.

The lens 30 may be made of transparent resin and has a parabolic lens surface. The shape of the lens surface is not limited to the parabolic shape, and the lens shape can be formed in spherical shape or elliptic shape.

The light source device 1 is assembled in the following procedures. The LED device 10 with the diffusing sheet 20 and other circuit parts are mounted on the circuit board 40. Then, the circuit board 40 is fixed in the housing 50. The lens 30 and the cover 60 are put on the housing 50 sequentially, a periphery of the lens 30 is held by the housing 50 and the cover 60. Thus, the lens 30 is fixed to the light source device 1.

An illumination operation of the light source device 1 will be explained. When power is provided to the LED device 10, the LED chip 11 of the LED device 10 emits blue light. A part of the blue light excites the fluorescent material when the blue light passes through the sealing member 72 of the LED device 10. Then, the fluorescent emits yellow fluorescence. As a result, the blue light and the yellow light are emitted from the LED device 10. Those lights are mixed and entered into a lower surface of the diffusing sheet 20. Then, the light that enters the diffusing sheet 20 is diffused at the lower surface of the diffusing sheet 20 and proceeds to an upper surface of the diffusing sheet 20. The light is diffused again and emitted at the upper surface of the diffusing sheet 20.

The light that passed through the diffusing sheet 20 enters an incident surface 31 of the lens 30. The light is converged in the lens 30. As a result, a directional light is emitted from the lens 30. The cover 60 blocks a peripheral portion of the directional light.

As mentioned above, the light from the LED device 10 is diffused at the diffusing sheet 20 and then converged at the lens 30. In other words, a uniform light is introduced to the lens 30. Because the light from the LED device 10 is diffused two times at the diffusing sheet 20, quite uniform light is introduced to the lens 30. Thus, the light emitted from the lens 30 is well equalized and directed. As a result, a color split at the periphery can be reduced around the periphery of the illumination area.

Meanwhile, the diffusing sheet 20 is kept in its sheet shape because the diffusing sheet 20 is located apart from the light emitting surface 73 of the LED device 10. Thus, the diffusing sheet 20 can perform a good diffusing effect. Because the light from the LED device 10 is diffused two times, at the lower surface and the upper surface of the diffusing sheet 20, the light passed through the diffusing sheet is well equalized.

The diffusing sheet 20 is different from a sheet that has one diffusing surface and one flat surface, the diffusing sheet 20 does not reflect a part of the light from the LED device 10. Thus, loss of the light of the present invention is minimized because the light diffusing sheet includes two light diffusing surfaces and these light diffusing surfaces do not work as a reflecting surface.

Second Exemplary Embodiment

Figure 4:
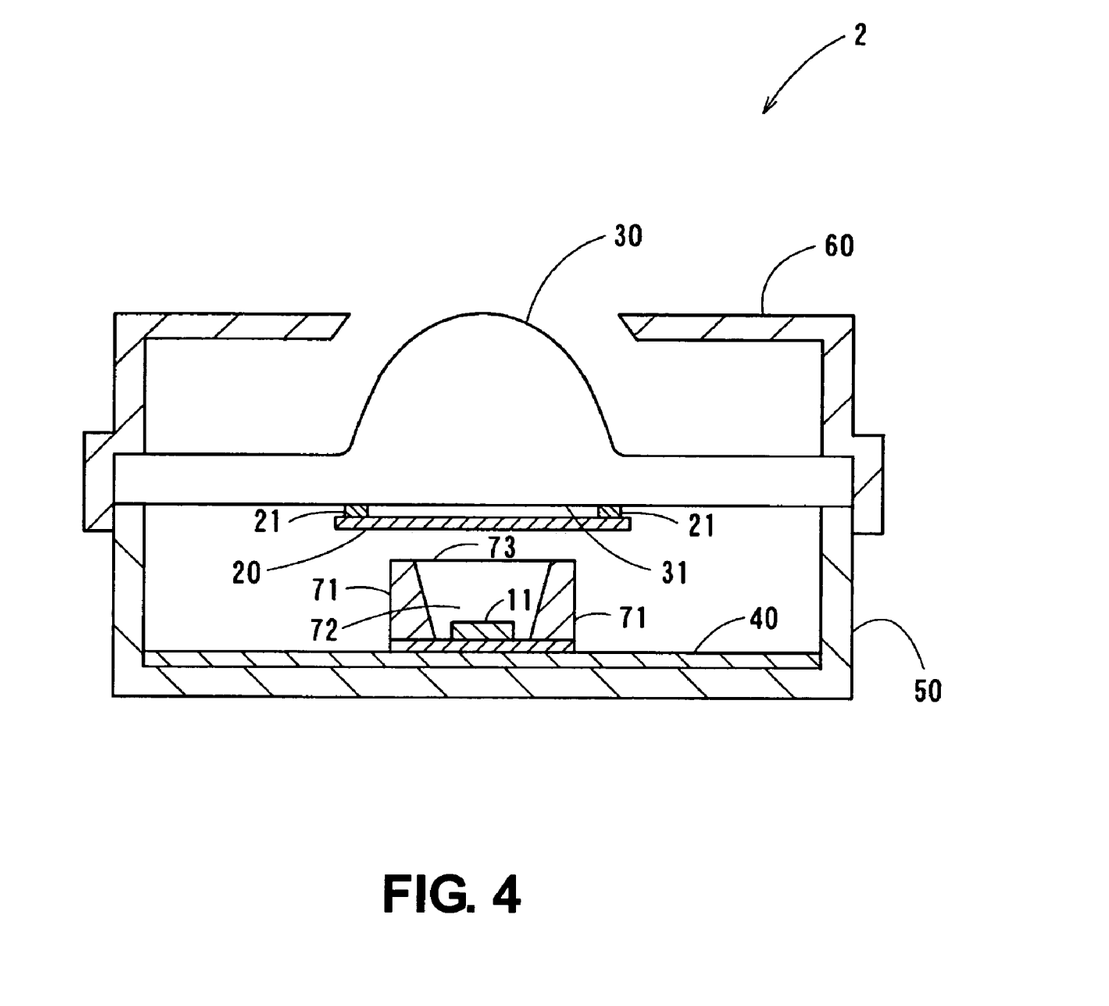
FIG. 4 is a cross sectional view of a light source device in an exemplary second embodiment.

An explanation for the same parts and elements as the above mentioned embodiment is abbreviated. As shown in FIG. 4, the diffusing sheet 20 of a light source device 2 is fixed to the lens 30. In detail, the periphery of the diffusing sheet 20 is adhered to the light receiving face 31 of the lens 30 by the adhesive agent 21. Thus, the diffusing sheet 20 covers a center part of the light receiving face 31 of the lens 30 through an air layer. In the present exemplary embodiment, the adhesive agent is made of acrylic emulsion and a thickness of the adhesive agent 21 is about 0.1 mm.

A light from the LED device 10 of the light source device 2, as well as the light source device 1, is diffused at the diffusing sheet 20 and then enters the lens 30. As a result, a well-equalized and directed light is emitted from the lens 30. Also, a color split at a periphery can be reduced around a periphery of an illumination area.

The diffusing sheet 20 of the light source device 2 is kept in its sheet shape because the diffusing sheet 20 is located apart from the light receiving face 31 of the lens 30. Thus, the diffusing sheet 20 can perform a good diffusing effect. Also, because the light from the LED device 10 is diffused two times, at the lower surface and the upper surface of the diffusing sheet 20, the light passed through the diffusing sheet 20 is well equalized. Furthermore, because the diffusing sheet 20 has thin diffusing layers, a good light transmittance can be obtained.

Third Exemplary Embodiment

Figure 5A:
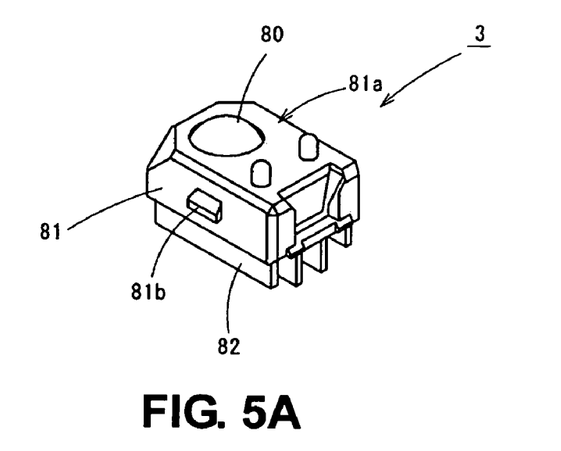
FIG. 5A is a perspective view of a light source device in an exemplary third embodiment.
Figure 5B:
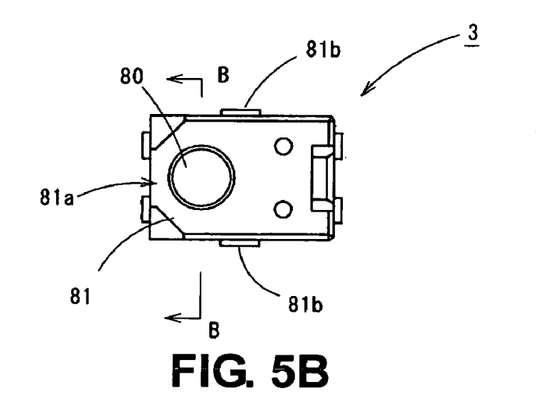
FIG. 5B is a top plan view of the light source device.
Figure 5C:
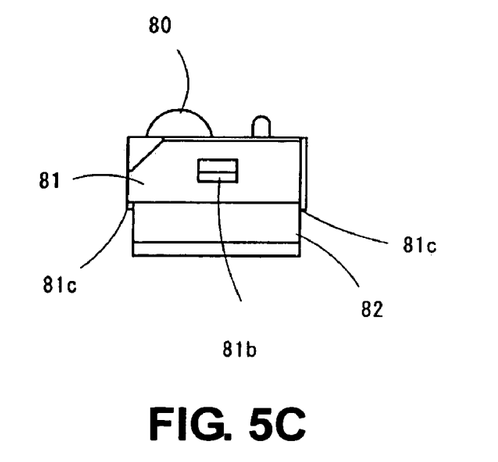
FIG. 5C is a front view of the light source device.
Figure 5D:
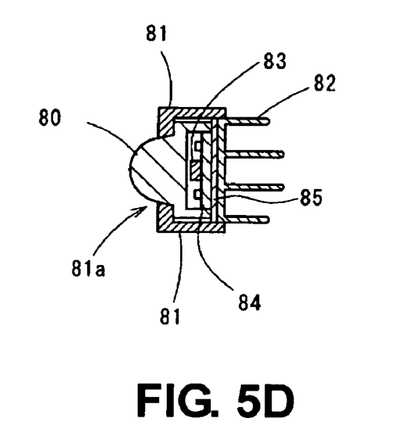
FIG. 5D is a cross sectional view at B-B line of FIG. 5B.
Figure 6A:
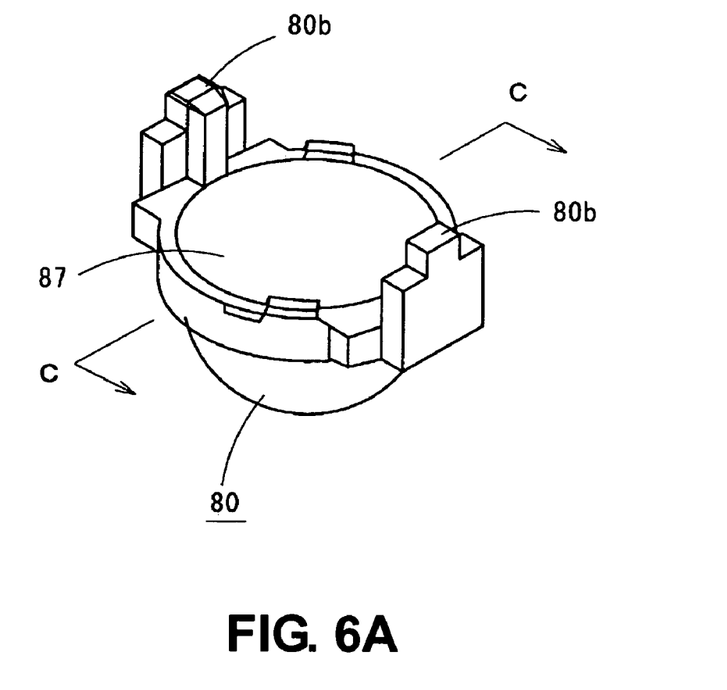
FIG. 6A is a perspective view of a lens of the light source device.
Figure 6B:
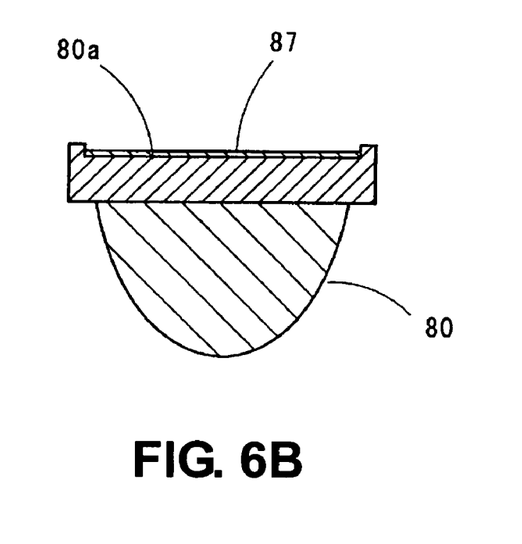
FIG. 6B is a cross sectional view at C—C line of FIG. 6A.

An explanation for the same parts and elements as the above mentioned exemplary embodiments is abbreviated. As shown in FIGS. 5A through 5D, a light source device 3 includes a lens 80, a cover 81, a chip element (a substrate 84 and mounted parts) and a heat sink 82. The lens 80 may be made of poly carbonate, which is transparent material. As shown in FIGS. 6A and 6B, the lens 80 includes a convex lens at an upper side and a pair of engaging legs 80b, which are formed for fixing and positioning, at a lower side. A periphery of a diffusing sheet 87 is adhered to a light receiving face 80a of the lens 80. LIGHT UP 100 PBU (product name, KIMOTO Co., Ltd.) is used for the diffusing sheet 87.

The cover 81 may be made of poly butylene terephthalate (PBT) resin and includes an opening 81a for the lens 80. The cover 81 also includes engaging claws 81b at a side for fixing the cover 81 to the light source device 3. The substrate 84 is a heat radiation substrate and made of Aluminum. A circuit pattern is formed on the substrate 84 (not shown). The substrate 84 includes a pair of notches 84a for fixing and positioning the lens 80.

Figure 7:
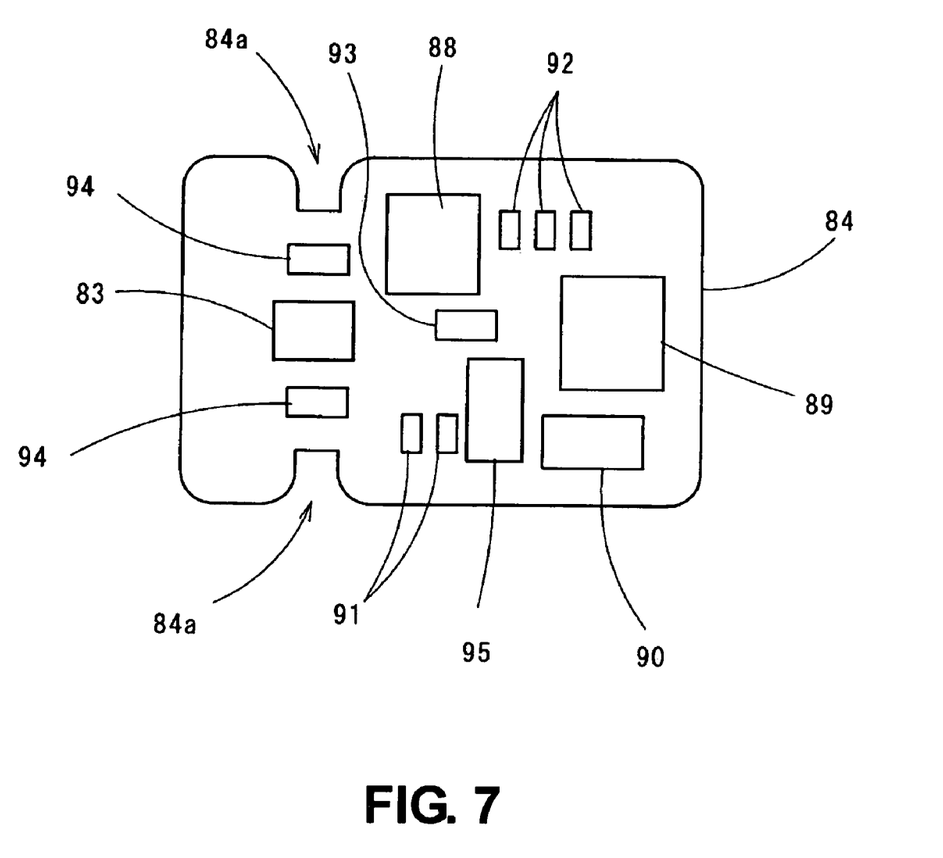
FIG. 7 is a top view of a chip element (a substrate and mounted parts)
Figure 8:
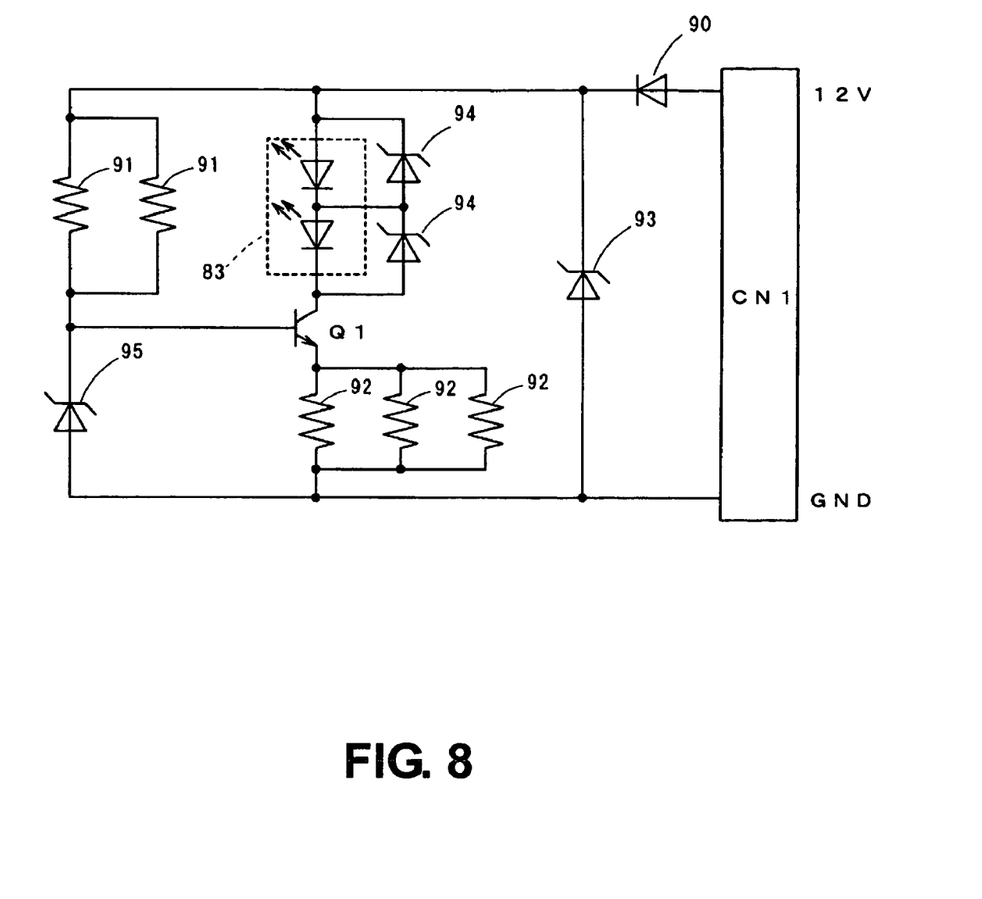
FIG. 8 is a circuit diagram of the light source device.
Figure 9A:
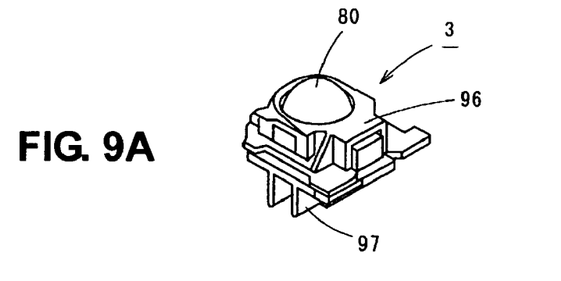
FIG. 9A is a perspective view of a light source device in an exemplary fourth embodiment.
Figure 9B:
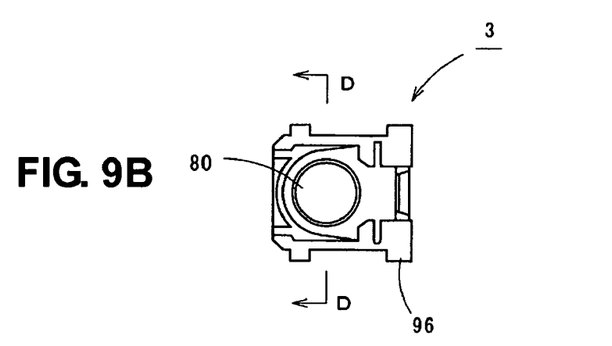
FIG. 9B is a top view of the light source device.
Figure 9C:
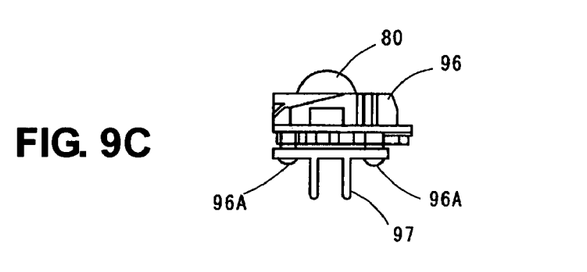
FIG. 9C is a front view of the light source device.
Figure 9D:
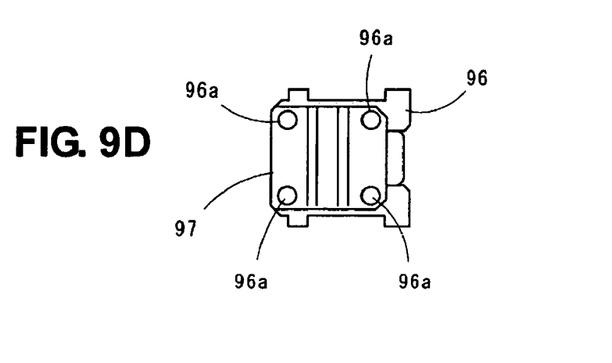
FIG. 9D is a back view of the light source device and a FIG. 9E is a cross sectional view at D-D line of FIG. 9D.
Figure 9E:
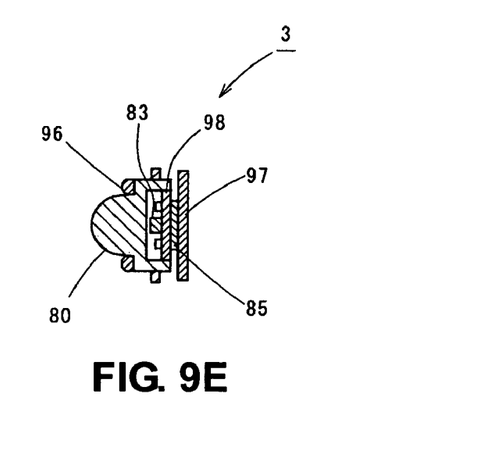

As shown in FIG. 7, an LED lamp 83, a transistor 88, a diode 90, resistances 91, 92 and zener diodes 93, 94,95 are mounted on the substrate 84 by solder and comprise a circuit diagram shown in FIG. 8. The number 89 shows a connector. The LED lamp 83 is a surface mount diode (SMD) and includes two blue LED chips. The LED lamp 83 includes a seal member that has fluorescent inside. The fluorescent is excited by blue light from the blue LED chips and emits yellow fluorescence. The blue light and the yellow fluorescence are mixed, then the LED lamp 83 emits white light.

The heat sink 82 may be made of aluminum and includes a plurality of fins for radiating heat. The light source device 3 includes a heat conduction sheet 85 between the heat sink 82 and the substrate 84. The heat conduction sheet 85, which is made of silicone, promotes heat conduction from the substrate 84 to the heat sink 82. The heat conduction sheet 85 also works as a buffer for avoiding a displacement of the substrate 84.

The light source device 3 is assembled in the following procedures. The heat conduction sheet 85 and the substrate 84 are put on the heat sink 82 in sequence. Then, The lens 80 is fixed on the substrate 84 in order to engage the engaging legs 80b with the notches 84a. The cover 81 is put on the lens 80. The cover 81, which includes legs 81c for welding, is welded to the heat sink 82. Thus, as shown in FIG. 5D, the lens 80 and the substrate 84 are hold by the cover 81 and the heat sink 82.

In the present embodiment, a light from the LED lamp 83 is diffused at the diffusing sheet 87 and then enters the lens 80. The light in the lens 80 is converged and emitted as a highly directional light. The cover 81 blocks a peripheral portion of the directional light emitted from the lens 80.

The diffusing sheet 87 of the light source device 3 is kept in its sheet shape because the diffusing sheet 87 is located apart from the light receiving face 80a of the lens 80. Thus, the diffusing sheet 87 can perform a good diffusing effect. Also, because the light from the LED lamp 83 is diffused two times, at the lower surface and the upper surface of the diffusing sheet 87, the light passed through the diffusing sheet 87 is well equalized. Furthermore, because the diffusing sheet 87 has thin diffusing layers, a good light transmittance can be obtained.

Fourth Exemplary Embodiment

An explanation for the same parts and elements as the above mentioned exemplary embodiments is abbreviated. As shown in FIGS. 9A through 9E, a light source device 4 includes a heat sink 97 that has four holes for fixing at corners the heat sink 97. Meanwhile, a cover 96 includes four legs 96a. The legs 96a are inserted into the holes of the heat sink 97 and welded to the heat sink 96. Thus, the cover 96 is fixed to the heat sink 97. The heat sink 96 is made of Aluminum and the cover 96 is made of poly butylene terephthalate (PBT) resin. As well as the light source device 3, the light source device 4 includes a diffusing sheet. The diffusing sheet is adhered to the light receiving face of the lens 80.

Figure 10:
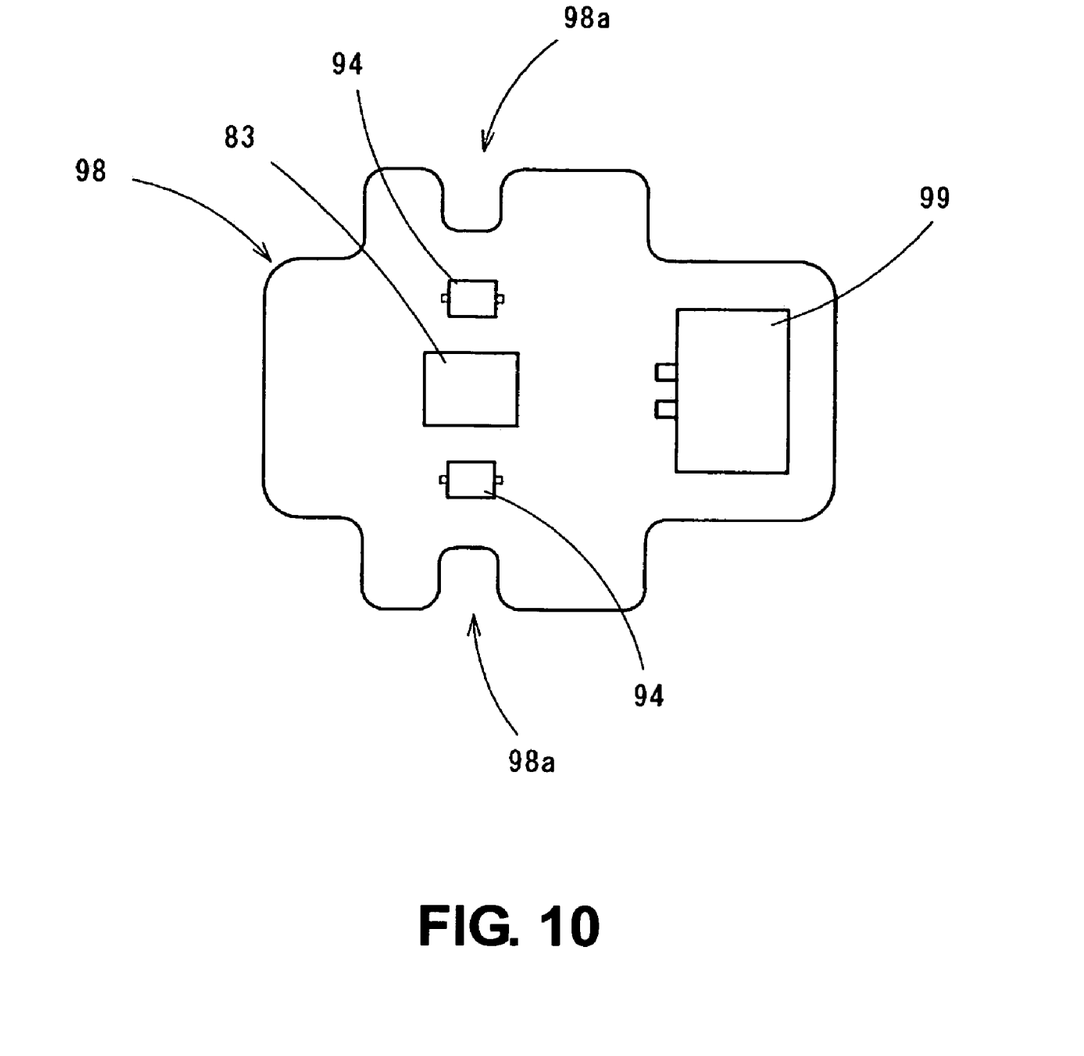
FIG. 10 is a top view of a chip element (a substrate and mounted parts)
Figure 11:
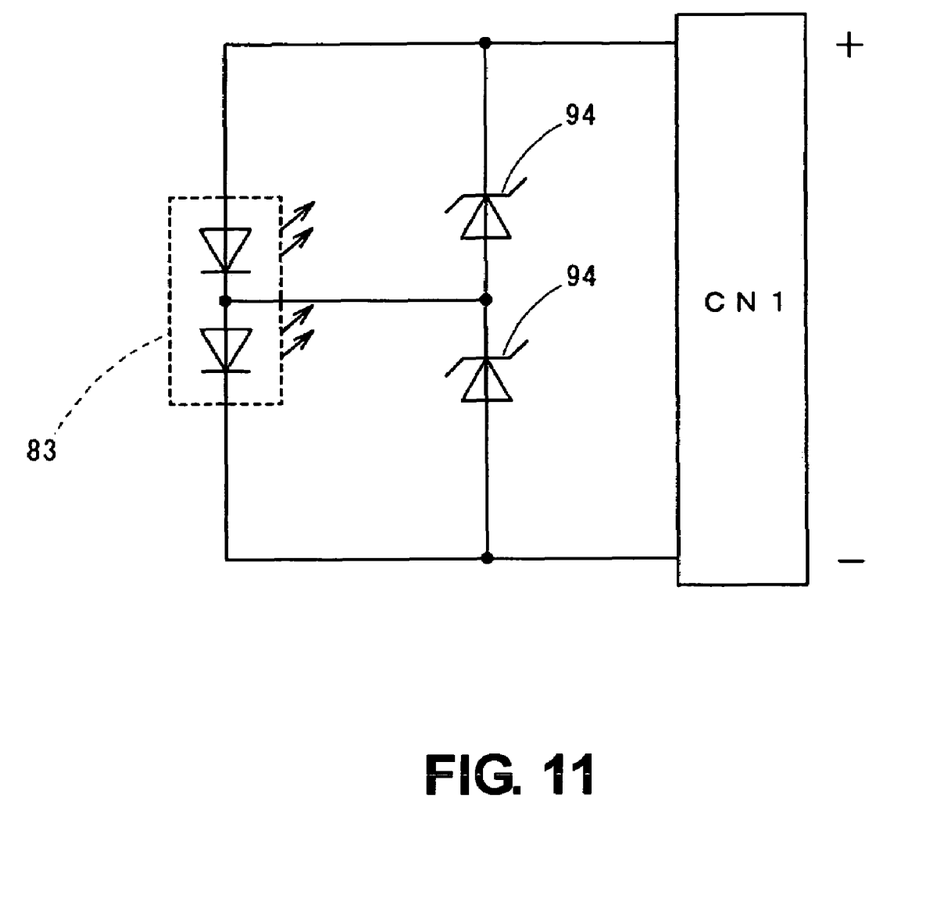
FIG. 11 is a circuit diagram of the light source device.

As shown in FIGS. 10 and 11, the light source device 4 includes the LED lamp 83 and two zener diodes 94. Number 99 is connector in FIG. 10. The light source device 4 the same effects as the light source device 3.

This disclosure is intended to explain how to fashion and use various exemplary embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiments were chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

The invention claimed is:

1. A light source device, comprising:
   a light emitting diode (LED) device including an LED chip, which emits a blue light, and a fluorescent substance, which converts a part of the light from the LED chip;
   a lens located on a side of a light emitting face of the LED device; and
   a light diffusing sheet located between the LED device and the lens and located apart from at least one of the LED device and the lens to provide an air gap therebetween, said air gap assisting to equalize a distribution of the light emitted from the LED chip and the light converted by the florescent substance,
   wherein a periphery of the light diffusing sheet is adhered to the light emitting face of the LED device by an adhesive agent in a manner to provide the air gap therebetween, and
   wherein a thickness of the adhesive agent is such that the air gap is less than approximately 0.2 mm.

2. The light source device according to claim 1, wherein the diffusing sheet comprises a light diffusing layer.

3. The light source device according to claim 1, wherein the light diffusing sheet includes light diffusing faces on two opposing surfaces thereof.

4. The light source device according to claim 1, wherein the fluorescent substance converts the blue light to a yellow light.

5. The light source device of claim 1, further comprising a reflector as a component of the LED device, wherein the light diffusing sheet is adhered to an upper surface of a periphery of the reflector by the adhesive agent.

6. An assembly comprising the light source device of claim 1.

7. A light source device, comprising:
   a light emitting diode (LED) device including an LED chip, which emits a blue light, and a fluorescent substance, which converts a part of the light from the LED chip;
   a lens located on a side of a light emitting face of the LED device; and
   a light diffusing sheet located between the LED device and the lens and located apart from at least one of the LED device and the lens to provide an air gap therebetween, said air gap assisting to equalize a distribution of the light emitted from the LED chip and the light converted by the fluorescent substance,
   wherein a periphery of the light diffusing sheet is adhered to a light receiving face of the lens by an adhesive agent in a manner to provide the air gap therebetween, and
   wherein a thickness of the adhesive agent is such that the air gap is less than approximately 0.2 mm.

8. The light source device according to claim 7, wherein the light diffusing sheet comprises a plurality of light diffusing surfaces.

9. The light source device according to claim 7, wherein the light diffusing sheet includes two light diffusing faces on opposite surfaces thereof.

10. The light source device according to claim 7, wherein the fluorescent material converts the blue light to a yellow fluorescence.

11. The light source device according to claim 7, wherein the distance between the light diffusing sheet and the LED device is less than approximately 0.2 mm.

12. The light source device of claim 7, wherein the light diffusing sheet covers a center part of the light receiving face of the lens through an air layer.

13. A light source device, comprising:
means for emitting a light at a first frequency and a light at a second frequency, the light of the second frequency resulting from a conversion of a portion of the light at the first frequency;
means for focusing the emitted light at the first and second frequencies;
means for diffusing said emitted light at the first and second frequencies, said means for diffusing located between said means for emitting and said means for focusing; and
means, including an air gap, for equalizing a distribution of the lights at the first and second frequencies prior to entering into the means for focusing,
wherein the means for diffusing is adhered, by an adhesive agent applied to a periphery of the means for diffusing said emitted light, to a light receiving face of the means for focusing the emitted light at the first and second frequencies in a manner to provide a predetermined distance therebetween to provide said air gap, wherein a thickness of the adhesive agent is such that the predetermined distance is less than approximately 0.2 mm.

14. A method of manufacturing a light source device that has an equalized distribution of two or more colors of light emitted therefrom, the method comprising:
mounting a light emitting diode assembly in a housing, the assembly including a light emitting diode that emits a light at a first frequency and a fluorescent material that converts a portion of the light at the first frequency into a light at a second frequency and emits the light at the second frequency; and
mounting a focusing lens to said housing, apart from a light emitting face of the light emitting diode assembly,
wherein one of the light emitting diode assembly and the focusing lens has attached thereto, by an adhesive agent, a light diffusing sheet that equalizes a distribution of two or more colors by being attached in such manner as to provide a predetermined separation air gap between the light diffusing sheet and one of a light emitting face of the light emitting diode assembly and a light receiving face of the focusing lens, wherein the adhesive agent is applied to a periphery of the light diffusing sheet to provide the separation air gap and a thickness of the adhesive agent is such that the separation air gap is less than approximately 0.2 mm.

15. The method of claim 14, wherein the light diffusing sheet comprises a sheet of material having an irregular surface thereon, the method further comprising:
adhering, with the adhesive agent having a thickness that provides the predetermined separation gap, the sheet of material to one of the light emitting face of the light emitting diode assembly and the light receiving face of the focusing lens.

16. The method of claim 15, wherein the predetermined separation gap is in a range of approximately 0.01 mm to approximately 0.2 mm.

17. The method of claim 14, wherein the sheet of material has the irregular surface on each of two opposing sides of said sheet.

* * * * *